US009041916B2

(12) United States Patent
Oh et al.

(10) Patent No.: US 9,041,916 B2
(45) Date of Patent: May 26, 2015

(54) THREE-DIMENSIONAL IMAGE SENSOR AND MOBILE DEVICE INCLUDING SAME

(75) Inventors: Min Seok Oh, Osan-si (KR); Hae Kyung Kong, Yongin-si (KR); Tae Chan Kim, Yongin-si (KR); Jung Chak Ahn, Yongin-si (KR); Moo Sup Lim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 365 days.

(21) Appl. No.: 13/615,860

(22) Filed: Sep. 14, 2012

(65) Prior Publication Data
US 2013/0201167 A1    Aug. 8, 2013

(30) Foreign Application Priority Data

Feb. 8, 2012    (KR) ........................ 10-2012-0012930

(51) Int. Cl.
| | |
|---|---|
| *H04N 13/02* | (2006.01) |
| *H01L 27/146* | (2006.01) |
| *H04N 5/3745* | (2011.01) |
| *G01S 7/486* | (2006.01) |

(52) U.S. Cl.
CPC ...... *H04N 13/0271* (2013.01); *H01L 27/14656* (2013.01); *H04N 5/37452* (2013.01); *G01S 7/4863* (2013.01)

(58) Field of Classification Search
USPC ............. 356/3.01–3.15, 4.01–4.1, 5.01–5.15, 356/6–22, 28, 28.5
See application file for complete search history.

(56) References Cited

U.S. PATENT DOCUMENTS

| | | | |
|---|---|---|---|
| 5,663,555 A * | 9/1997 | Miyawaki et al. ......... | 250/208.1 |
| 6,396,570 B2 | 5/2002 | Takayanagi et al. | |
| 7,436,496 B2 | 10/2008 | Kawahito | |
| 7,671,391 B2 | 3/2010 | Kawahito | |
| 2009/0284731 A1 | 11/2009 | Jin et al. | |
| 2010/0290674 A1 | 11/2010 | Kim | |
| 2011/0188026 A1 * | 8/2011 | Lee et al. .................... | 356/5.01 |

FOREIGN PATENT DOCUMENTS

| | | |
|---|---|---|
| JP | 2001-183458 | 7/2001 |
| JP | 2001281336 | 10/2001 |
| JP | 2010175435 | 8/2010 |

* cited by examiner

*Primary Examiner* — Luke Ratcliffe
(74) *Attorney, Agent, or Firm* — Volentine & Whitt, PLLC (57) ABSTRACT

A 3D image sensor includes a depth pixel that includes; a photo detector generating photo-charge, first and second floating diffusion regions, a first transfer transistor transferring photo-charge to the first floating diffusion region during a first transfer period in response to a first transfer gate signal, a second transfer transistor transferring photo-charge to the second floating diffusion region during a second transfer period in response to a second transfer gate signal, and an overflow transistor that discharges surplus photo-charge in response to a drive gate signal. Control logic unit controlling operation of the depth pixel includes a first logic element providing the first transfer gate signal, a second logic element providing the second transfer gate signal, and another logic element providing the drive gate signal to the overflow transistor when the first transfer period overlaps, at least in part, the second transfer period.

19 Claims, 8 Drawing Sheets

THREE-DIMENSIONAL IMAGE SENSOR AND MOBILE DEVICE INCLUDING SAME

CROSS-REFERENCE TO RELATED APPLICATIONS

This application claims priority under 35 U.S.C. §119 from Korean Patent Application No. 10-2012-0012930 filed on Feb. 8, 2012, the subject matter of which is hereby incorporated by reference.

BACKGROUND

Embodiments of the inventive concept relate to three-dimensional (3D) image sensors and mobile devices including same. More particularly, embodiments of the inventive concept relate to 3D image sensors having increasing demodulation contrast, as well as mobile devices including same.

Certain types of 3D image sensors are capable of measuring the time required for a ranging signal to travel to, be reflected by, and then return from a target object. This measured time is referred to as a time-of-flight (TOF), and may subsequently be used to calculate the distance between the image sensor (or an emitting source) and the target object. The ranging signal used to determine TOF may be a microwave signal, an optical or infrared signal (e.g., an optical pulse), an ultrasonic signal, etc.

Some 3D image sensors essentially determine TOF (and the corresponding distance or 'depth" separating the 3D image sensor and the target object) using a so-called "depth pixel". In one configuration the depth pixel may have a 1-tap pixel architecture that sequentially applies gate control signal separated by 0°, 90°, 180°, and 270° of phase difference to the depth pixel with corresponding time lags. The resulting plurality of frame signals may then be used to calculate the depth to the target object.

However, this approach is subject to a number of error inducing incidences. For example, to ensure accuracy of the foregoing calculation, it is necessary to effectively move (or transfer) photo-charge to a sensing node without degradation of demodulation contrast due to an unintended resistance-capacitance (RC) delay.

SUMMARY

According to certain embodiments of the inventive concept, there is provide a three-dimensional (3D) image sensor comprising; a pixel array having a plurality of depth pixels. Each depth pixel in the plurality of depth pixels comprises; a photo detector configured to generate photo-charge, first and second floating diffusion regions, a first transfer transistor configured to transfer photo-charge from the photo detector to the first floating diffusion region during a first transfer period in response to a first transfer gate signal, a second transfer transistor configured to transfer photo-charge from the photo detector to the second floating diffusion region during a second transfer period in response to a second transfer gate signal, and an overflow transistor that controls discharge of surplus photo-charge generated by the photo detector in response to a drive gate signal. Control logic unit for each depth pixel comprises; a first logic element that provides the first transfer gate signal, a second logic element that provides the second transfer gate signal, and another logic element that provides the drive gate signal to the overflow transistor when the first transfer period overlaps, at least in part, the second transfer period.

According to certain other embodiments of the inventive concept, there is provide an electronic device comprising; a three-dimensional (3D) image sensor, and an image signal processor configured to control operation of the 3D image sensor. The 3D image sensor comprises; a pixel array comprising a plurality of pixels each of which comprises a photo detector configured to generate photo-charge, at least two floating diffusion regions, at least two transfer transistors configured to respectively transfer the photo-charge to the at least two floating diffusion regions in response to a transfer gate signal and the respective floating diffusion regions to transfer the photo-charge to a first terminal, and at least one overflow transistor configured to discharge surplus photo-charge generated at the photo detector in response to a drive gate signal, and a readout circuit configured to read out depth information sensed by the pixel array, the readout circuit comprising a control logic unit configured to apply the drive gate signal to the overflow transistor when a first transfer period of a first diffusion region overlap with a second transfer period of a second diffusion region.

BRIEF DESCRIPTION OF THE DRAWINGS

The above and other features and advantages of the inventive concept will become more apparent by describing in detail exemplary embodiments thereof with reference to the attached drawings in which.

DETAILED DESCRIPTION OF THE EMBODIMENTS

Embodiments of the inventive concept now will be described in some additional detail with reference to the accompanying drawings. The inventive concept may, however, be embodied in many different forms and should not be construed as being limited to only the illustrated embodiments. Rather, these embodiments are provided so that this disclosure will be thorough and complete, and will fully convey the scope of the invention to those skilled in the art. Throughout the written description and drawings, like reference numbers and labels are used to denote like or similar elements and features throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Here, the term "image sensor" is used to denote a class of devices incorporating at least charge coupled devices (CCDs) and complementary metal oxide semiconductor (CMOS) image sensors. CCDs have less noise and provide better picture quality than CMOS image sensors, but requires high voltage and high manufacturing cost.

In contrast, the CMOS image sensor is easy to operate and can be implemented using various scanning methods. In addition, since a related signal processing circuit may be commonly integrated into a single chip, the product incorporating the CMOS image sensor may be readily miniaturized. Since conventionally available CMOS fabrication technologies and equipment may be used, the manufacturing cost associated with CMOS image sensors is relatively low. Finally, the power consumed by CMOS image sensors is very low, so CMOS image sensors may be efficiently incorporated into mobile devices that operate using battery power.

The foregoing advantages make the CMOS image sensor an excellent choice for use within a wide range of products. Accordingly, embodiments of the inventive concept described hereafter are will be drawn to CMOS image sensors. However, those skilled in the art will recognize that other embodiments of the inventive concept may be applied to CCDs.

Figure 8:
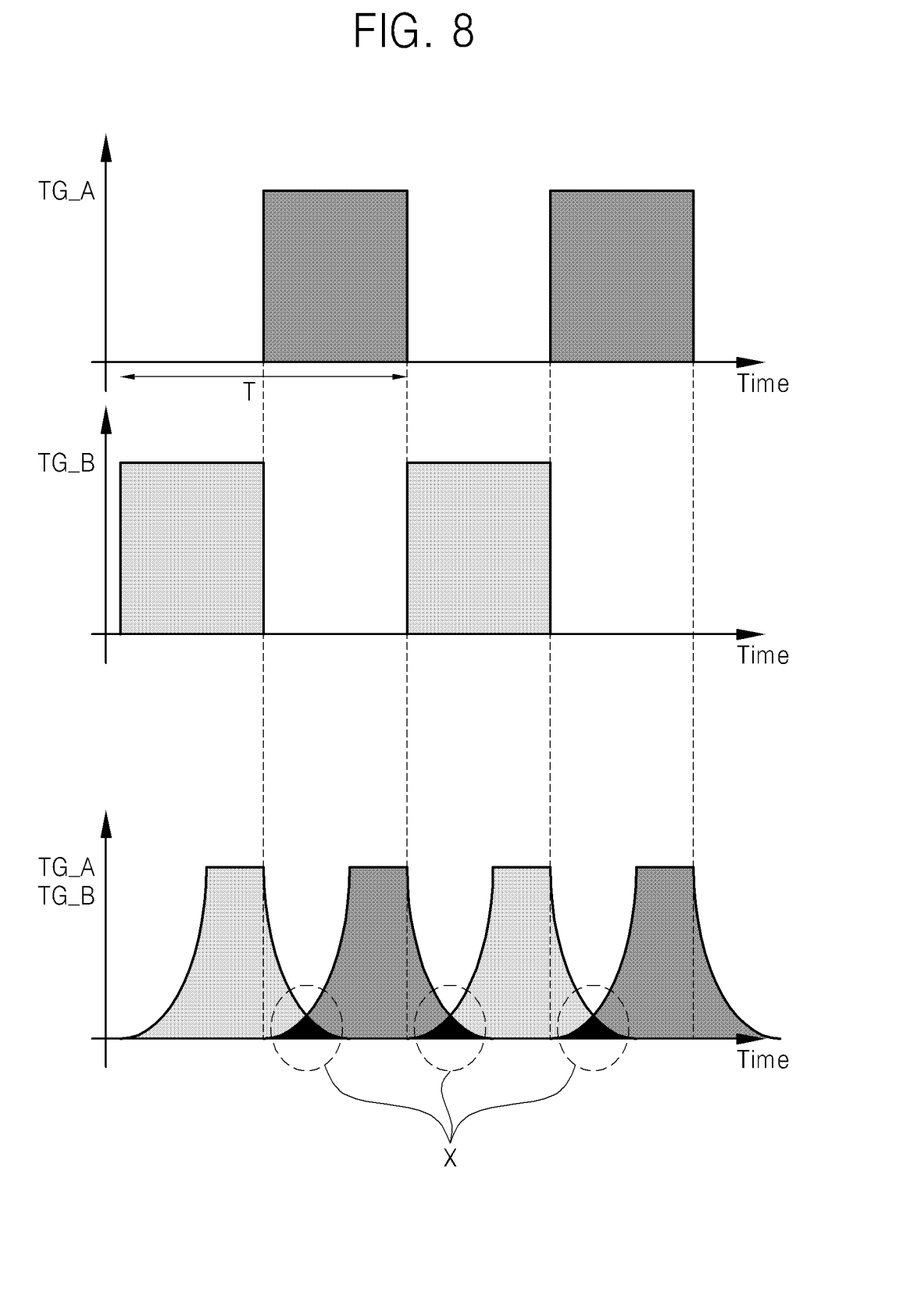
FIG. 8 is a timing chart showing the operation of a pixel in a comparison example.

By way of further comparison, Figure (FIG. 8 is a timing chart illustrating, in relevant part, operation of a conventional image sensor pixel. Referring to FIG. 8, a three-dimensional (3D) image sensor modulates an optical ranging signal, emits the modulated optical ranging signal towards a target object, and detects a reflected optical signal returned from the target object. At this point in time, the reflected optical signal must be received and demodulated by the 3D image sensor in order to determine a phase difference between the emitted optical ranging signal and the returned reflected optical signal in at least one depth pixel. The determined phase difference between these two optical signals may be used to acquire depth information.

The depth pixel includes a transfer gate or a photo gate of a transfer transistor used to demodulate the reflected optical signal that has greater capacitance than the transfer gate of a two-dimensional (2D) image sensor. This greater capacitance results in an increased RC delay. As a result, the rise time and fall time of transfer control signals TG_A and TG_B applied to the transfer transistor are undesirably delayed by the RC delay. The duty cycle defined by the transfer control signals is correspondingly smaller, thereby yielding improved demodulation contrast.

However, as illustrated in FIG. 8, an overlap period X may occur due to the RC delay. During this overlap period X, surplus photo-charge may be generated that seriously degrades the accuracy of the depth information. That is, the surplus photo-charge generated during the overlap period X between the delayed transfer control signals TG_A and TG_B may adversely affect the determination of the phase difference between the two optical signals, thereby resulting in deteriorated demodulation contrast.

Figure 1:
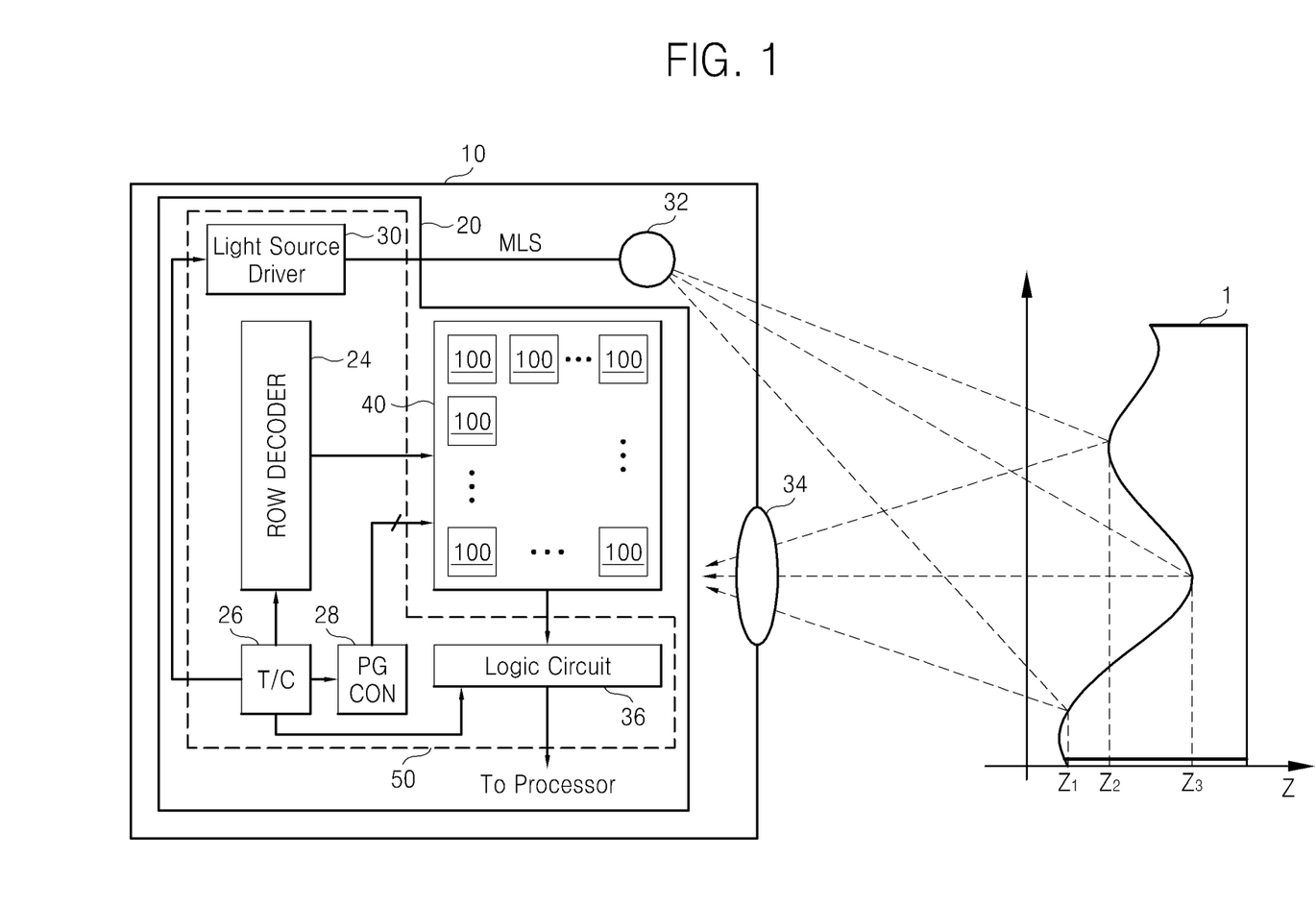
FIG. 1 is a block diagram of a three-dimensional (3D) image sensor according to some embodiments of the inventive concept.

FIG. 1 is a block diagram of a 3D image sensor 10 according to an embodiment of the inventive concept that may more accurately determine a distance separating a target object from the 3D image sensor using the time of flight (TOF) principles briefly described above. The 3D image sensor 10 generally includes a semiconductor integrated circuit (IC) 20, a light (or optical signal) source 32, and a lens module 34.

The semiconductor IC 20 includes a pixel array 40 in which a plurality of pixels 100 are arranged and a readout circuit 50. The readout circuit 50 acquires (or "reads out") image information sensed by the pixel array 40. The readout circuit 50 illustrated in FIG. 1 includes a row decoder 24, a light source driver 30, a timing controller 26, a photo gate controller 28, and a logic circuit 36.

The row decoder 24 selects a row from among a plurality of rows in response to a row address output from the timing controller 26. Here, a row is a set of depth pixels arranged in an X-direction within the pixel array 40.

The photo gate controller 28 may be used to generate a plurality of photo gate control signals and provide same to the pixel array 40 under the control of the timing controller 26.

The light source driver 30 may be used generate a clock signal MLS that drives the light source 32 under the control of the timing controller 26. The light source 32 emits a modulated (ranging) optical signal towards the target object 1 in response to the clock signal MLS. In certain embodiments of the inventive concept, a light emitting diode (LED), an organic LED (OLED), or a laser diode may be used as the light source 32, and the modulated optical signal may be, for example, a sine wave or a square wave.

The light source driver 30 provides the clock signal MLS or information derived from the clock signal MLS to the photo gate controller 28. A portion of the modulated optical signal emitted by the light source 32 is returned to the 3D image sensor 10 from the target object 1 as a reflected optical signal. When multiple reflected optical signals indicating different point distances (e.g., $Z_1$, $Z_2$, and $Z_3$) between the 3D image sensor 10 and the target object 1 are received, a single (final) distance Z value may be calculated.

In one example, a competent calculation process assumes that a modulated optical signal of COS $\omega t$ is emitted by the light source 32 and a reflected optical signal received by a depth pixel 100 is COS ($\omega t+\Phi$), where a phase shift ($\Phi$) caused by the TOF is defined as:

$$\Phi = 2*\omega*Z/C = 2*(2\pi f)*Z/C,$$

where the constant "C" is the speed of light. Accordingly, the final distance Z from the light source 32 and the pixel array 40 to the target object 1 may be calculated as:

$$Z=\Phi*C/(2*\omega)=\Phi*C/(2*(2\pi f)).$$

The multiple reflected optical signals may be focused onto the pixel array 40 through the lens module 34. The logic circuit 36 may process respective signals sensed by multiple depth pixels 100 in the pixel array 40, and provide the processed signals to a processor under the control of the timing controller 26. The processor may then be used to calculate the distance based on the processed signals. When the 3D image sensor 10 includes an integral processor, the 3D image sensor 10 may be a distance measuring device.

The 3D image sensor 10 and processor may be implemented on separate chips, respectively. The logic circuit 36 may include an analog-to-digital (A/D) conversion block capable of converting analog sense signals provide by the pixel array 40 into corresponding digital signals. The logic circuit 36 may also include a correlated doubling sampling (CDS) block that performs CDS on the digital signals provided by the A/D conversion block.

Alternatively, the logic circuit 36 may include a CDS block that performs CDS on the analog sense signals provided by the pixel array 40 and an A/D conversion block that converts the analog CDS signals into corresponding digital signals.

The logic circuit 36 may further include a column decoder that transmits an output signal of the A/D conversion block or an output signal of the CDS block to the processor under the control of the timing controller 26.

In certain embodiments, the 3D image sensor 10 may include a plurality of light sources arranged (e.g., in a circle) around the lens module 34. However, only one light source 32 is illustrated in FIG. 2 for clarity of the description.

Optical signals (including the reflected optical signal(s)) are received by the pixel array 40 through the lens module 34 are demodulated by the pixels 100. Thus, the optical signals received by the pixel array 40 through the lens module 34 may be interpreted as image data associated with the image of the target object (and surroundings).

Figure 2:
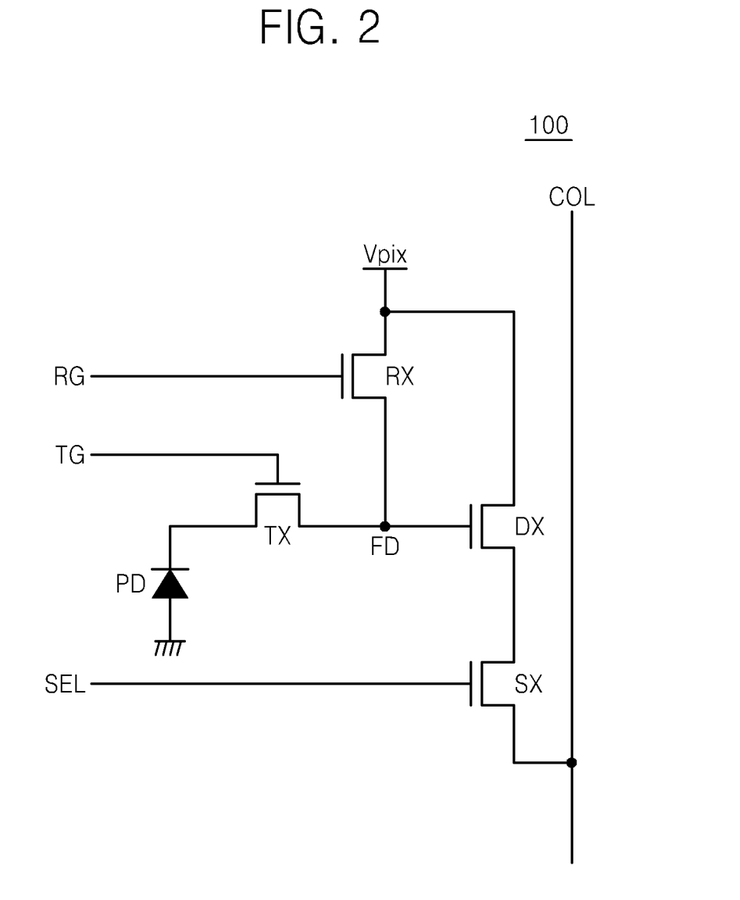
FIG. 2 is a detailed circuit diagram of a pixel.

FIG. 2 is a circuit diagram further illustrating in relevant part a pixel 100 of the pixel array 40 of FIG. 1. Referring to FIG. 2, the pixel 100 includes a photo detector PD, a transfer transistor TX, a floating diffusion node FD, a reset transistor RX, a drive transistor DX, and a select transistor SX.

Here, the photo detector PD accumulates photo-charge in accordance with the optical energy of the reflected optical signal. The photo detector PD may include at least one of a photo diode, a photo transistor, a photo gate, a pinned photo-diode (PPD), and/or combination of same.

The transfer transistor TX is connected between the photo detector PD and the floating diffusion node FD. The transfer transistor TX includes a transfer gate controlling charge to be transferred from the photo detector PD to the floating diffusion node FD. The transfer transistor TX is activated by a transfer gate signal TG. For instance, when the transfer gate signal TG is "high", the transfer transistor TX transmits charge generated by the photo detector PD. The reset transistor RX is connected between a supply voltage terminal providing a supply voltage Vpix and the floating diffusion node FD. The reset transistor RX includes a reset gate for resetting the photo detector PD or the floating diffusion node FD. The reset transistor RX is activated by a reset gate signal RG. For instance, when the reset gate signal RG is high, the reset transistor RX may be activated.

The drive transistor DX or source follower transistor DX includes a source follower output gate. The source follower transistor DX is activated by a source follower gate signal output from the floating diffusion node FD. The source follower transistor DX converts charge stored in the floating diffusion node FD into an output voltage.

The select transistor SX is connected between the floating diffusion node FD and the source follower transistor DX. The select transistor SX includes a select gate. The select transistor SX is activated by a select gate signal SEL.

A plurality of the control signals TG, RG, and SEL may be provide from the row driver 24 of FIG. 1.

The example illustrated in FIG. 2 uses a 4-transistor (4T) structure including a single photo detector PD and four MOS transistors TX, RX, DX, and SX. However, embodiments of the inventive concept is not restricted to this type of structure. Other circuits including three or more transistors and having a source follower transistor DX and the select transistor SX and the photo detector PD may be used within embodiments of the inventive concept.

Figure 3:
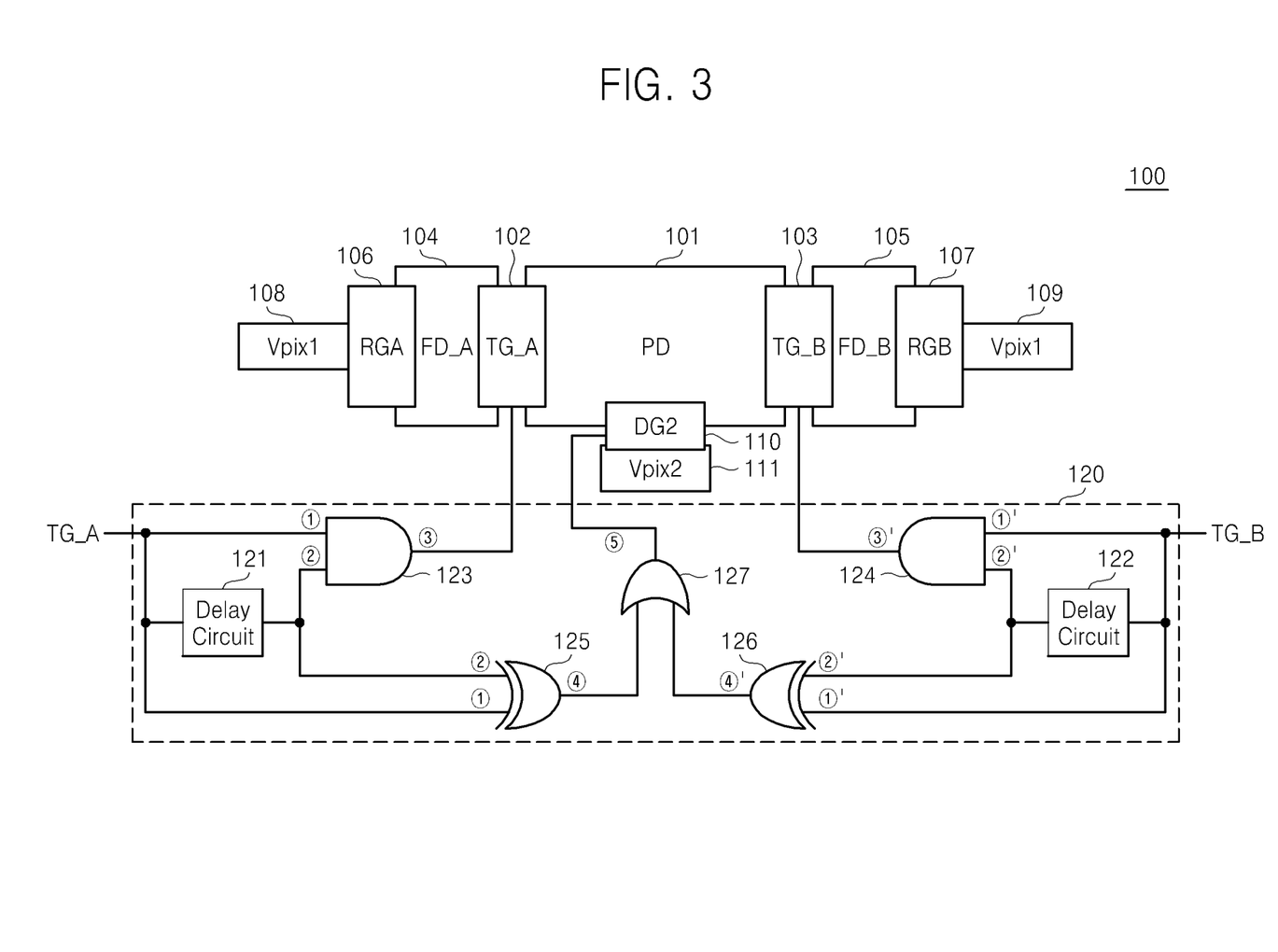
FIG. 3 is a cross-sectional view of a pixel included in the 3D image sensor illustrated in FIG. 1 according to some embodiments of the inventive concept.

FIG. 3 is an idealized cross-sectional view of the pixel 100, together with exemplary control logic unit 120, that may be included within the 3D image sensor 10 of FIG. 1 according to an embodiment of the inventive concept. In certain embodiments, the row driver 24 of the 3D image sensor 10 shown in FIG. 1 may include the control logic unit 120.

Referring to FIG. 3, the pixel 100 includes a photo detector 101, floating diffusion regions 104 and 105, transfer transistors 102 and 103, reset transistors 106 and 107, first terminal nodes 108 and 109, an overflow transistor 110, and a second terminal 111. The overflow transistor 110 is connected between the photo detector 101 and the second terminal 111. When a drive gate signal ⑤ is applied to an overflow gate of the overflow transistor 110, the overflow transistor 110 discharges surplus photo-charge to the second terminal 111, the surplus photo-charge having been generated by the photo detector 101 during an overlap period wherein a first transfer period and a second transfer period overlap (e.g., occur at least in part simultaneously).

Within embodiments of the inventive concept, when the first transfer period for photo-charge to a first floating diffusion region does not overlap a second transfer period for photo-charge to a second floating diffusion region, the control logic unit 120 applies respective transfer gate signal(s) to the transfer transistor(s). However, when the first transfer period for photo-charge to the first floating diffusion region overlaps with the second transfer period for photo-charge to the second floating diffusion region, the control logic unit 120 applies a drive gate signal to the overflow transistor.

The control logic unit 120 illustrated in FIG. 3 includes first and second delay elements 121 and 122, first logic element 123, second logic element 124, third logic element 125, fourth logic element 126, and fifth logic element 127.

The first delay element 121 receives a first transfer control signal TG_A (or ①) and provides a delayed first transfer control signal ② after applying a delay period to the first transfer control signal TG_A. The second delay element 122 receives a second transfer control signal TG_B (or ①') and provides a delayed second transfer control signal ②' after applying a delay period to the second transfer control signal TG_B.

Each of the first and second logic elements 123 and 124 may be used to provide a corresponding first and second transfer gate signal ③ or ③' during the first transfer period in which a first and second transfer control signals ① or ①' overlap with delayed first and second transfer control signal ② or ②'. That is, each of the first and second logic elements 123 and 124 may perform an AND operation between the first/second transfer control signal ①/①' and a corresponding delayed first/second transfer control signal ②/②' to generate the first and second transfer gate signals ①/①'.

In certain embodiments, the first and second transfer control signals ①/①' respectively received by the first logic elements 123 and 124 may have a phase difference of 180 degrees.

Each of the third and fourth logic elements 125 and 126 may be used to provide a corresponding first and second overflow control signal ④/④' during the second transfer period in which the first/second transfer control signals ①/①' do not overlap the delayed first and second transfer control signal ②/②'. That is, each of the third and fourth logic elements 125 and 126 may perform an XOR operation between the first/second transfer control signal ①/①' and a corresponding delayed first/second transfer control signal ②/②' to generate the first and second overflow control signals ④/④'.

The fifth logic element 127 receives the first and second overflow control signals ④/④' and generates a drive gate signal ⑤ applied to the overflow transistor 110. That is, the fifth logic element 127 may perform an OR operation between the first and second overflow control signals ④/④' to generate the drive gate signal ⑤.

Figure 4:
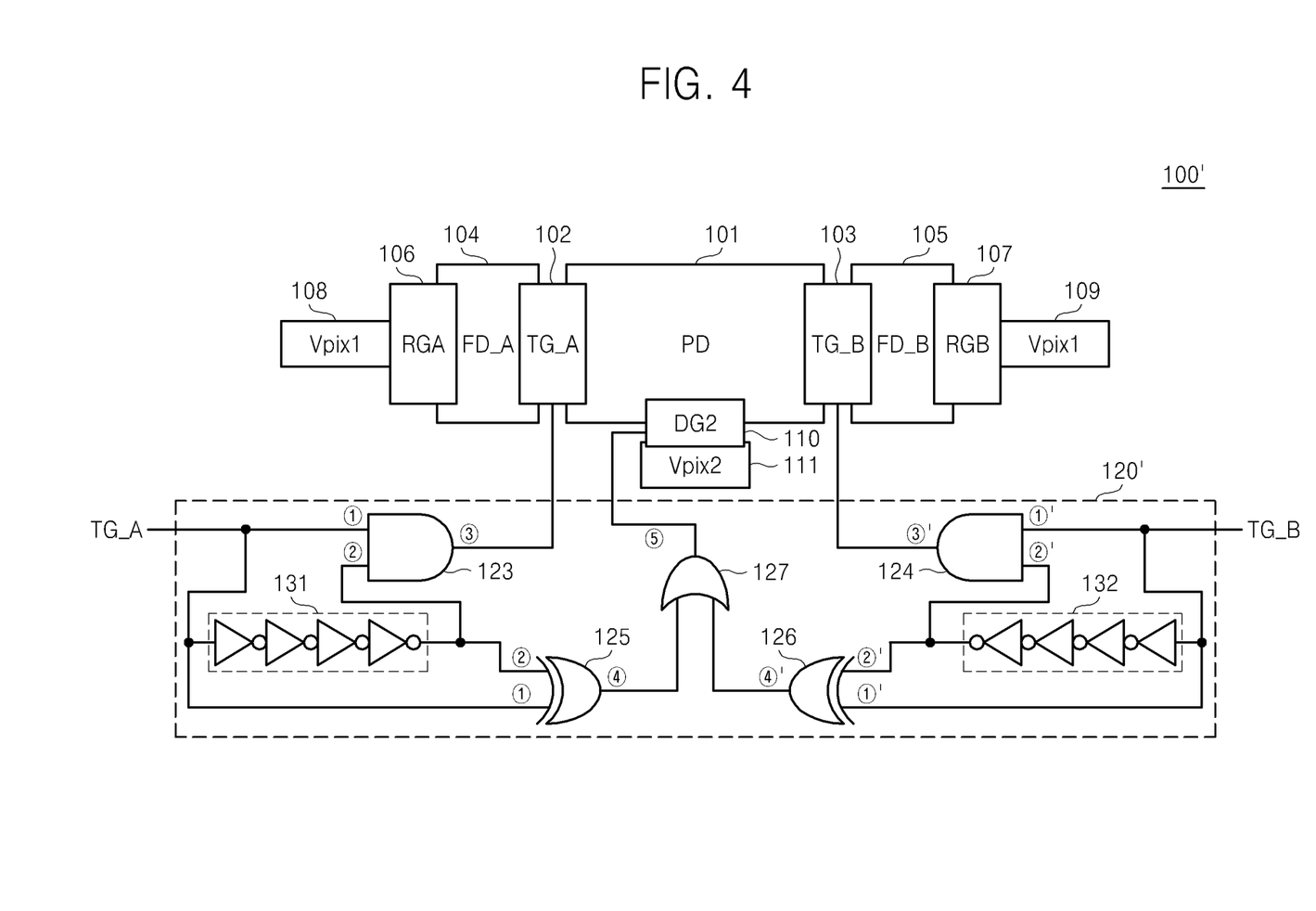
FIG. 4 is a cross-sectional view of a pixel included in the 3D image sensor illustrated in FIG. 1 according to other embodiments of the inventive concept.

FIG. 4 is an idealized cross-sectional view of the pixel 100', together with exemplary control logic unit 120', that may be included within the 3D image sensor 10 of FIG. 1 according to another embodiment of the inventive concept. To avoid redundancy, only differences between the embodiments of FIGS. 3 and 4 will be described.

Comparing FIGS. 3 and 4, delay elements 131 and 132 are more particularly shown in FIG. 4 as being implemented by a plurality of series-connected inverters. However, other types of delay elements may be alternately used.

Figure 5:
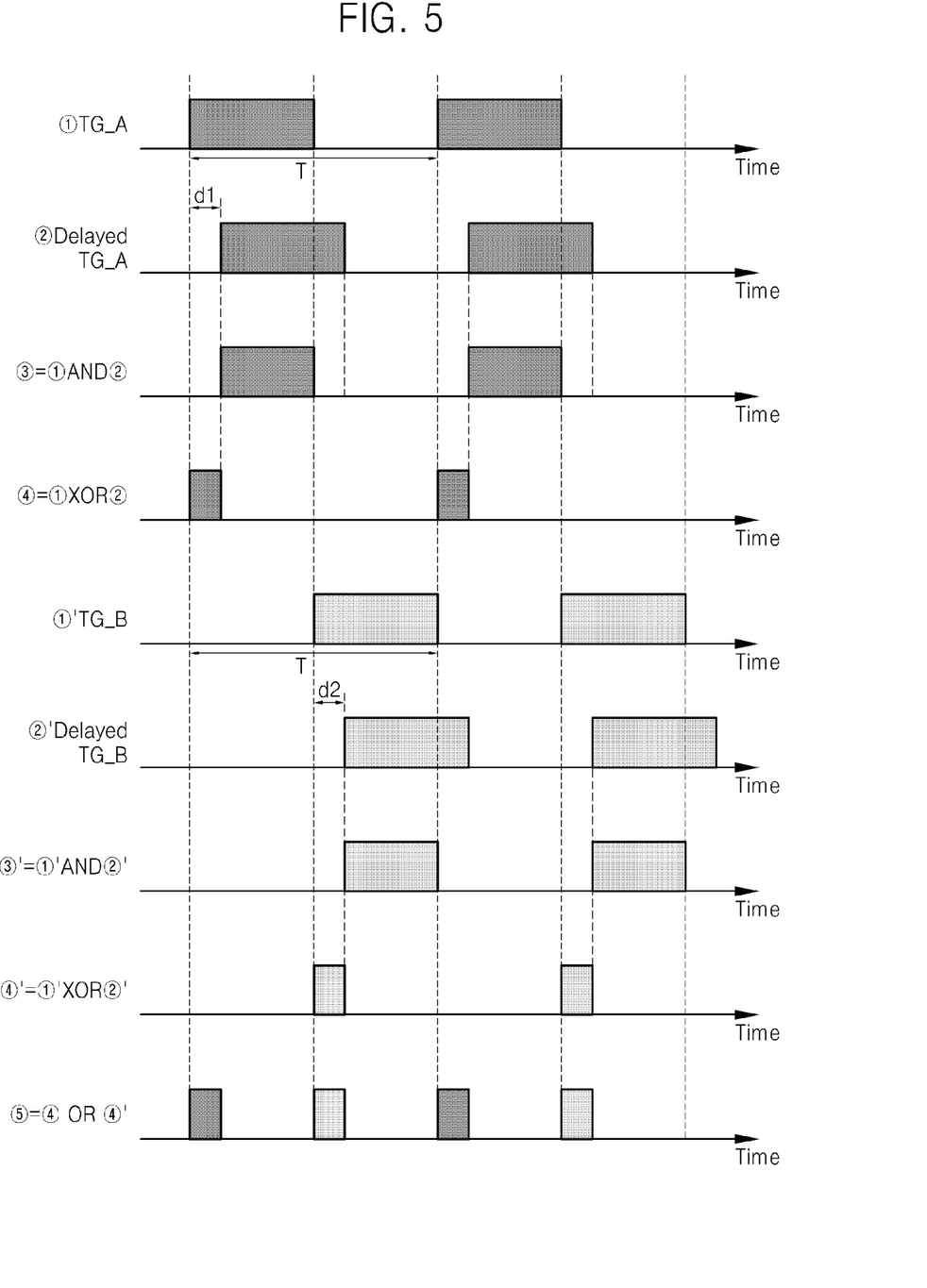
FIG. 5 is a timing chart showing the operations of a pixel according to some embodiments of the inventive concept.

FIG. 5 is a timing chart further illustrating operation of the pixel(s) described above with reference to FIGS. 3 and 4 according to certain embodiments of the inventive concept.

Referring to FIGS. 3 and 5, the first transfer control signal TG_A ① and the second transfer control signal TG_B ①', each having a defined activation period "T" are received through a readout circuit in the 3D image sensor.

The first transfer control signal TG_A ① is delayed by the first delay element 121 to generate the first delayed transfer control signal Delayed TG_A ②. The applied delay period may fixed or variable according to various control settings. Similarly, the second transfer control signal TG_B ①' is delayed by the second delay element 122 to generate the second delayed transfer control signal Delayed TG_B ②'. Here again, the applied delay period may fixed or variable according to various control settings.

The first logic element 123 performs an AND operation on the first transfer control signal TG_A ① and the delayed first transfer control signal Delayed TG_A ② to generate the first transfer gate signal ③. And the first transfer gate signal ③ is applied to the first transfer transistor 102 so that photo-charge generated by the photo detector 101 is transferred to the first floating diffusion region 104.

The second logic element 124 performs an AND operation on the second transfer control signal TG_B ①' and the delayed second transfer control signal Delayed TG_A ②' to generate the second transfer gate signal ③'. And the second transfer gate signal ③' is applied to the second transfer transistor 103 so that photo-charge generated by the photo detector 101 is transferred to the second floating diffusion region 105.

The third logic element 125 performs an XOR operation on the first transfer control signal TG_A ① and the delayed first transfer control signal Delayed TG_A ② to generate a first overflow control signal ④. The fourth logic element 126 performs an XOR operation on the second transfer control signal TG_A ①' and the delayed second transfer control signal Delayed TG_A ②' to generate a second overflow control signal ④'.

The first overflow control signal ④ and the second overflow control signal ④' are then applied to the fifth logic circuit 127, and the fifth logic circuit 127 generate the gate drive signal ⑤.

The first overflow control signal generated by the third logic element 125 may be applied directly to the overflow transistor 110 in the 3D image sensor 10. However, when there are at least two transfer transistors 102 and 103, the fifth logic circuit 127 may effectively add corresponding overflow control signals (e.g., first overflow control signal ④ and the second overflow control signal ④') respectively received from different terminals to generate a drive gate signal. Accordingly, a first transfer control signal and a second transfer control signal may be applied to the transfer transistors 102 and 103, respectively, without overlap, so that the transfer transistors 102 and 103 transfer photo-charge to the floating diffusion regions 104 and 105, respectively, in the 3D image sensor 10. In addition, during an overlap period for the first transfer control signal and the second transfer control signal, the drive gate signal is applied to the gate of the overflow transistor 110, so that surplus photo-charge is discharged to the second terminal 111 in the 3D image sensor 10.

As a result, deterioration of demodulation contrast occurring when transfer control signals overlap is prevented. In addition, surplus photo-charge causing the deterioration of demodulation contrast is discharged without increasing the frequency of a master clock signal on which the transfer control signals are based, and therefore, the demodulation contrast is increased and depth errors are decreased.

Figure 6:
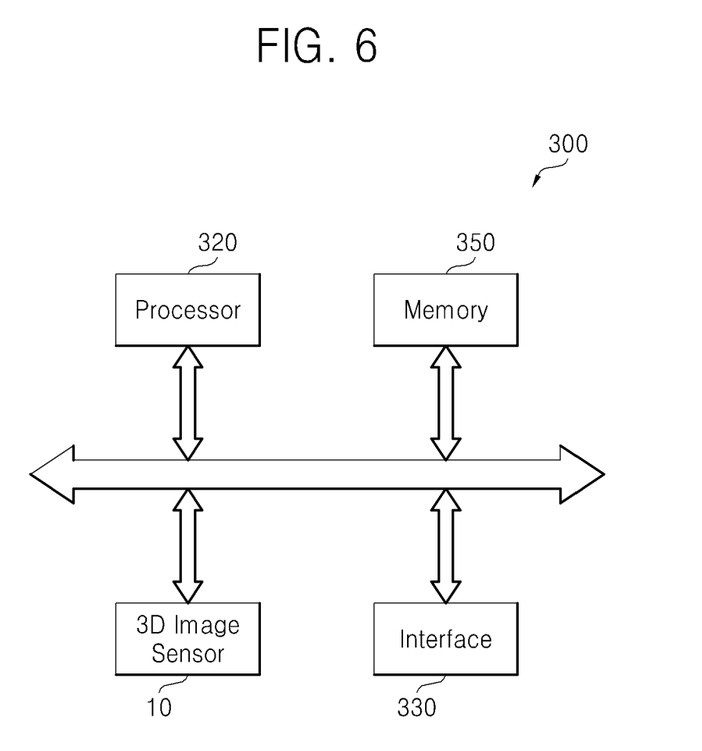
FIG. 6 is a block diagram of an electronic device according to some embodiments of the inventive concept.

FIG. 6 is a block diagram of an electronic device 300 according to an embodiment of the inventive concept. The electronic device 300 may be a digital camera, a mobile phone with an embedded digital camera, or any electronic device including a digital camera. The electronic device 300 may process 2D image information or 3D image information. The electronic device 300 includes the 3D image sensor 10.

The electronic device 300 may include an image signal processor 320 controlling the operation of the 3D image sensor 10.

The electronic device 300 may also include an interface 330. The interface 330 may be an image display device or an input/output device.

When the electronic device 300 includes the image display device 330, the electronic device 300 may also include a memory device 350 storing a still image or a moving image captured by the 3D image sensor 10 under the control of the image signal processor 320. The memory device 350 may be implemented by a non-volatile memory device. The non-volatile memory device may include a plurality of non-volatile memory cells.

Each of the plurality of non-volatile memory cells may be implemented as an EEPROM (Electrically Erasable Programmable Read-Only Memory), a flash memory, a Magnetic RAM (MRAM), a Spin-Transfer Torque MRAM, a Conductive bridging RAM (CBRAM), a Ferroelectric RAM (MRAM), a Phase change RAM (PRAM) also called as an Ovonic Unified Memory (OUM), a Resistive RAM (RRAM or ReRAM), a Nanotube RRAM (RRAM), a Polymer RAM (PoRAM), a Nano Floating Gate Memory (NFGM), a holographic memory, a Molecular Electronics Memory Device, or an Insulator Resistance Change Memory.

Figure 7:
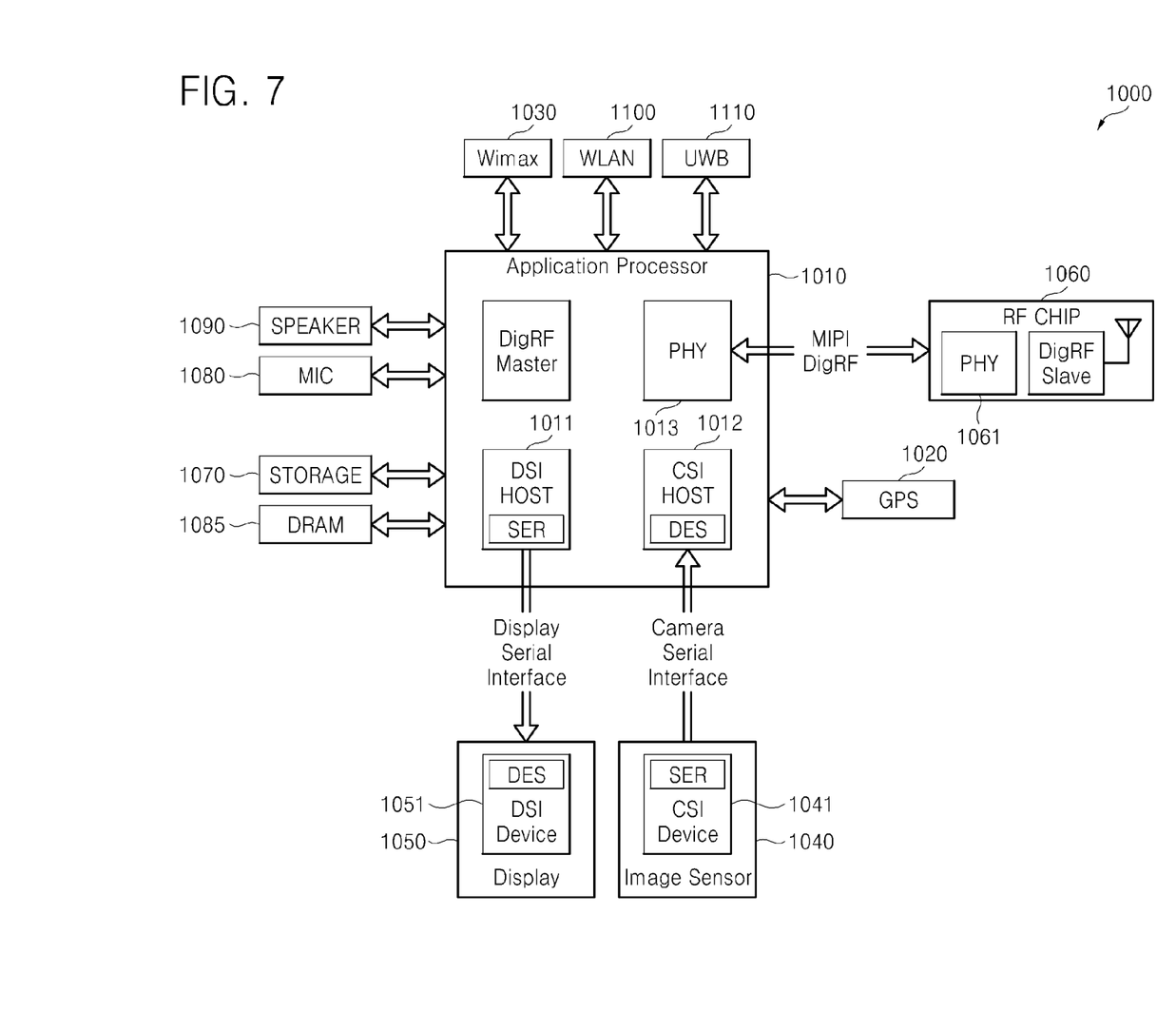
FIG. 7 is a block diagram of an electronic system including an image sensor according to some embodiments of the inventive concept.

FIG. 7 is a block diagram of an electronic system including an image sensor according to an embodiment of the inventive concept. The electronic system 1000 may be implemented by a data processing apparatus, such as a mobile phone, a personal digital assistant (PDA), a portable media player (PMP), an IP TV, or a smart phone that can use or support the MIPI interface. The electronic system 1000 includes an application processor 1010, an image sensor 1040, and a display 1050.

A CSI host 1012 included in the application processor 1010 performs serial communication with a CSI device 1041 included in the image sensor 1040 through CSI. For example, an optical de-serializer may be implemented in the CSI host 1012, and an optical serializer may be implemented in the CSI device 1041.

A DSI host 1011 included in the application processor 1010 performs serial communication with a DSI device 1051 included in the display 1050 through DSI. For example, an optical serializer may be implemented in the DSI host 1011, and an optical de-serializer may be implemented in the DSI device 1051.

The electronic system 1000 may also include a radio frequency (RF) chip 1060 which communicates with the application processor 1010. A physical layer (PHY) 1013 of the electronic system 1000 and a PHY 1061 of the RF chip 1060 communicate data with each other according to a MIPI DigRF standard. The electronic system 1000 may further include at least one element among a GPS 1020, a storage device 1070, a microphone 1080, a DRAM 1085 and a speaker 1090. The electronic system 1000 may communicate using Wimax 1030, WLAN 1100 or USB 1110, etc.

As described above, according to some embodiments of the inventive concept, deterioration of demodulation contrast, which occurs in a 3D image sensor and a mobile device including the 3D image sensor when transfer control signals partly overlap with each other due to RC delay, is prevented. In addition, surplus photo-charge causing the deterioration is discharged without increasing the frequency of a master clock signal on which the transfer control signals are based, and therefore, the demodulation contrast is increased and depth errors are decreased.

While the inventive concept has been particularly shown and described with reference to exemplary embodiments thereof, it will be understood by those of ordinary skill in the art that various changes in forms and details may be made therein without departing from the scope of the inventive concept as defined by the following claims.

What is claimed is:

1. A three-dimensional (3D) image sensor comprising:
a pixel array comprising a plurality of depth pixels, wherein each depth pixel in the plurality of depth pixels comprises:
a photo detector configured to generate photo-charge,
first and second floating diffusion regions,
a first transfer transistor configured to transfer photo-charge from the photo detector to the first floating diffusion region during a first transfer period in response to a first transfer gate signal,
a second transfer transistor configured to transfer photo-charge from the photo detector to the second floating diffusion region during a second transfer period in response to a second transfer gate signal, and
an overflow transistor that controls discharge of surplus photo-charge generated by the photo detector in response to a drive gate signal; and
a control logic unit that controls operation of each depth pixel and comprises:
a first logic element that provides the first transfer gate signal,
a second logic element that provides the second transfer gate signal, and
another logic element that provides the drive gate signal to the overflow transistor when the first transfer period overlaps, at least in part, the second transfer period.

2. The 3D image sensor of claim 1, further comprising a readout circuit including the control logic unit and being configured to read out depth information sensed by the pixel array.

3. The 3D image sensor of claim 2, wherein the control logic unit is disposed in a row driver within the readout circuit.

4. The 3D image sensor of claim 2, wherein the first transfer control signal and the second transfer control signal have a 180-degree phase difference.

5. The 3D image sensor of claim 2, wherein at least one of the first transfer gate signal is applied to the first transfer transistor and the second transfer gate signal is applied to the second transfer transistor when the first transfer period does not overlap the second transfer period.

6. The 3D image sensor of claim 5, further comprising:
a first reset transistor that controls transfer of photo charge from the first floating diffusion region to a first terminal; and
a second reset transistor that controls transfer of photo charge from the second floating diffusion region to the first terminal.

7. The 3D image sensor of claim 6, wherein the overflow transistor discharges the surplus photo-charge to a second terminal in response to the drive gate signal.

8. The 3D image sensor of claim 1, wherein the control logic unit further comprises:
a first delay circuit that receives a first transfer control signal and provides a delayed first transfer control signal; and
a second delay circuit that receives a second transfer control signal and provides a delayed second transfer control signal.

9. The 3D image sensor of claim 8, wherein each of the first and second delay circuits comprises a plurality of series-connected inverters.

10. The 3D image sensor of claim 8, wherein the first logic element provides the first transfer gate signal by performing an AND operation on the first transfer control signal and the delayed first transfer control signal, and
the second logic element provides the second transfer gate signal by performing an AND operation on the second transfer control signal and the delayed second transfer control signal.

11. The 3D image sensor of claim 10, further comprising:
a third logic element that provides a first overflow control signal by performing an exclusive OR operation on the first transfer control signal and the delayed first transfer control signal, and
a fourth logic element that provides a second overflow control signal by performing an exclusive OR operation on the second transfer control signal and the delayed second transfer control signal,
wherein the another logic element is a fifth logic element that provides the drive gate signal by performing an OR operation on the first overflow control signal and the second overflow control signal.

12. An electronic device comprising:
a three-dimensional (3D) image sensor; and
an image signal processor configured to control operation of the 3D image sensor, wherein the 3D image sensor comprises:
a pixel array comprising a plurality of pixels each of which comprises a photo detector configured to generate photo-charge, at least two floating diffusion regions, at least two transfer transistors configured to respectively transfer the photo-charge to the at least two floating diffusion regions in response to one of a plurality of transfer gate signals and the respective floating diffusion regions to transfer the photo-charge to a first terminal, and at least one overflow transistor configured to discharge surplus photo-charge generated the photo detector in response to a drive gate signal; and
a readout circuit configured to read out depth information sensed by the pixel array, the readout circuit comprising a control logic unit configured to apply the drive gate signal to the overflow transistor when a first transfer period during which photo-charge is transferred to a first diffusion region among the at least two diffusion regions in response to a first transfer gate signal overlaps with a second transfer period during which photo-charge is transferred to a second diffusion region among the at least two diffusion regions in response to a second transfer gate signal.

13. The electronic device of claim 12, wherein the control logic unit comprises:
a first logic element that provides the first transfer gate signal;
a second logic element that provides the second transfer gate signal;
another logic element that provides the drive gate signal to the overflow transistor when the first transfer period overlaps, at least in part, the second transfer period;
a first delay circuit that receives a first transfer control signal and provides a delayed first transfer control signal; and
a second delay circuit that receives a second transfer control signal and provides a delayed second transfer control signal.

14. The electronic device of claim 13, wherein the first logic element provides the first transfer gate signal by performing an AND operation on the first transfer control signal and the delayed first transfer control signal, and
the second logic element provides the second transfer gate signal by performing an AND operation on the second transfer control signal and the delayed second transfer control signal.

15. The electronic device of claim 14, a third logic element that provides a first overflow control signal by performing an exclusive OR operation on the first transfer control signal and the delayed first transfer control signal, and
a fourth logic element that provides a second overflow control signal by performing an exclusive OR operation on the second transfer control signal and the delayed second transfer control signal,
wherein the another logic element is a fifth logic element that provides the drive gate signal by performing an OR operation on the first overflow control signal and the second overflow control signal.

16. The electronic device of claim 13, wherein the first transfer control signal and the second transfer control signal are provide by the processor and have a 180-degree phase difference.

17. The electronic device of claim 16, wherein at least one of the first transfer gate signal is applied to the first transfer transistor and the second transfer gate signal is applied to the second transfer transistor when the first transfer period does not overlap the second transfer period.

18. The electronic device of claim 12, wherein the control logic unit is disposed in a row driver of the readout circuit.

19. A mobile device comprising:
a three-dimensional image sensor; and
a display configured to display image data processed by the three-dimensional image sensor,
wherein the three-dimensional image sensor comprises:
a light source emitting an modulated optical signal towards a target object;
a lens module configured to receive a portion of the modulated optical signal reflected by the target object and focus the reflected optical signal onto a pixel array including a depth pixel, wherein the depth pixel comprises:
a photo detector that generates photo-charge in response to the reflected optical signal,
first and second floating diffusion regions on opposing sides of the photo detector,
a first transfer transistor configured to transfer photo-charge from the photo detector to the first floating diffusion region during a first transfer period in response to a first transfer gate signal,
a second transfer transistor configured to transfer photo-charge from the photo detector to the second floating diffusion region during a second transfer period in response to a second transfer gate signal, and
an overflow transistor that controls discharge of surplus photo-charge generated by the photo detector in response to a drive gate signal; and
a control logic unit that controls operation of each depth pixel and comprises:
a first logic element that provides the first transfer gate signal,
a second logic element that provides the second transfer gate signal, and
another logic element that provides the drive gate signal to the overflow transistor when the first transfer period overlaps, at least in part, the second transfer period.

* * * * *